(12) United States Patent
Nambu et al.

(10) Patent No.: US 8,349,087 B2
(45) Date of Patent: Jan. 8, 2013

(54) SEMICONDUCTOR DEVICE MANUFACTURING METHOD, WAFER TREATMENT SYSTEM, AND RECORDING MEDIUM

(75) Inventors: Hidetaka Nambu, Yamagata (JP); Nobuo Hironaga, Yamagata (JP); Futoshi Ota, Yamagata (JP); Toru Yokoyama, Yamagata (JP); Osamu Sugawara, Yamagata (JP); Ryo Satou, Yamagata (JP); Masato Tamura, Yamagata (JP)

(73) Assignee: Renesas Electronics Corporation, Kawasaki-Shi, Kanagawa (JP)

( * ) Notice: Subject to any disclaimer, the term of this patent is extended or adjusted under 35 U.S.C. 154(b) by 374 days.

(21) Appl. No.: 12/654,987

(22) Filed: Jan. 12, 2010

(65) Prior Publication Data

US 2010/0184296 A1      Jul. 22, 2010

(30) Foreign Application Priority Data

Jan. 16, 2009   (JP) .................................... 2009-8102

(51) Int. Cl.
```
B08B 3/12     (2006.01)
B08B 6/00     (2006.01)
B08B 7/00     (2006.01)
B08B 7/02     (2006.01)
C25F 1/00     (2006.01)
C25F 3/30     (2006.01)
C25F 5/00     (2006.01)
```

(52) U.S. Cl. ................ 134/1; 134/1.1; 134/1.2; 134/1.3
(58) Field of Classification Search .................. None
See application file for complete search history.

(56) References Cited

U.S. PATENT DOCUMENTS

| | | | |
|---|---|---|---|
| 5,525,542 A * | 6/1996 | Maniar et al. ................. | 438/669 |
| 6,758,876 B2 | 7/2004 | Suzuki et al. | |
| 6,899,145 B2 * | 5/2005 | Aggarwal ........................ | 141/11 |
| 6,996,453 B2 | 2/2006 | Ahn et al. | |
| 7,523,769 B2 | 4/2009 | Miyajima et al. | |
| 2002/0124906 A1 | 9/2002 | Suzuki et al. | |
| 2004/0105738 A1 | 6/2004 | Ahn et al. | |
| 2006/0088406 A1 * | 4/2006 | Miyajima et al. ............. | 414/805 |
| 2007/0151620 A1 * | 7/2007 | Okabe .............................. | 141/63 |

FOREIGN PATENT DOCUMENTS

| | | |
|---|---|---|
| JP | 2002-261159 A | 9/2002 |
| JP | 2004-311940 A | 11/2004 |
| JP | 2006-128153 A | 5/2006 |
| JP | 2006-351868 A | 12/2006 |

* cited by examiner

*Primary Examiner* — Duy Deo
(74) *Attorney, Agent, or Firm* — McGinn IP Law Group, PLLC

(57) ABSTRACT

A semiconductor device manufacturing method includes loading plural dry-etched wafers one by one in a container having a side door so as to be disposed substantially horizontally and in layers vertically therein; and blowing out a purge gas horizontally to those wafers loaded in the container for 30 sec or more after all the subject wafers are loaded in the container while the side door is open.

11 Claims, 8 Drawing Sheets

340

340

370

370

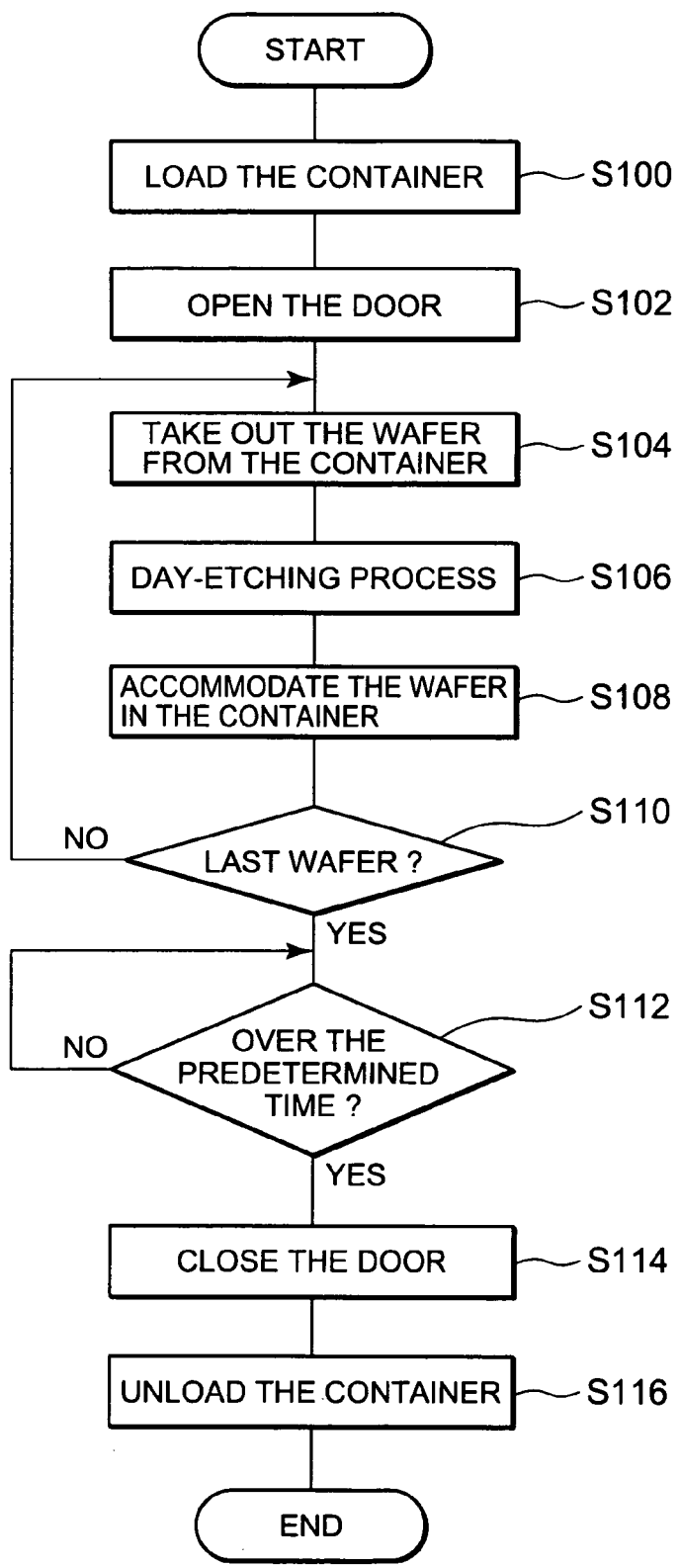

FIG. 7

| PURGE GUS | NO SUPPLY | SUPPLY | | | |
|---|---|---|---|---|---|
| | | 2sec | 30sec | 5min | 7min |
| SLOT 1 (FIRST) | × | ○ | ○ | ○ | ○ |
| SLOT 24 (LAST) | × × | × | ○ | ○ | ○ |

1

SEMICONDUCTOR DEVICE MANUFACTURING METHOD, WAFER TREATMENT SYSTEM, AND RECORDING MEDIUM

BACKGROUND OF THE INVENTION

1. Field of the Invention

The present invention relates to a semiconductor device manufacturing method, a wafer treatment system, and a recording medium.

2. Description of the Related Art

Conventionally, when treating wafers in such a manufacturing apparatus as an etching one, it has been required to load a predetermined number of wafers in such a container as an FOUP (Front Opening Unified Pod) and transfer the container among manufacturing apparatuses. Each time such a container is loaded in a manufacturing apparatus, the door of the container is opened and wafers are unloaded from the container, then subjected to the treatment in the manufacturing apparatus one by one. When the treatment is finished, the wafers are reloaded into the container sequentially. And when all the subject wafers are loaded in the container, the door is closed and the container is transferred to the manufacturing apparatus in the next process. Those wafers loaded in such a container have been subjected to, for example, a clean gas blowing process according to the conventional technique (e.g., the patent document 1 (JP-A -2004-311940)).

The patent document 2 (JP-A-2006-128153) describes a configuration of an apparatus that removes contaminants, etc. from wafers loaded in a pod by blowing such a clean gas to the top surfaces of those wafers through a gas supply pipe disposed in the upper portion of an internal opening according to the FIMS (Front-opening Interface Mechanical Standard).

On the other hand, the patent document 3 (JP-A-2006-351868) describes a configuration of another apparatus that includes a substrate W treatment unit and a base used to mount a container C for loading plural substrates W. In the container C are disposed those substrates W substantially horizontally and in layers vertically. The container C is provided with an opening used to load/unload the substrates W therein/therefrom at its one side. Outside the opening are provided plurality of gas supply holes and each of those gas supply holes is oriented so as to supply the gas substantially horizontally to each space between the substrates in the container C. This configuration is effective to remove the extraneous particles adhered inside the carrier and those adhered to the wafers in the carrier.

Furthermore, the patent document 4 (JP-A-2002-261159) describes a substrate transfer container provided with an air cleaner or dehumidifier used to remove the water content, etc. from the air supplied in the manufacturing processes of semiconductor chips with use of a low dielectric constant insulation film.

Furthermore, conventional dry-etching processes have often been confronted with a problem that foreign matters are generated at the bottoms of recessed portions if such a recessed portion as a wiring groove, a via hole, or a contact hole is formed in an interlayer insulation film, for example, on a wafer with use of a stopper, which is an etching stop film that contains nitrogen.

As a result of careful examinations, the present inventor et al have found that generation of such foreign matters is caused by a gas (degas) generated by reaction between the etching gas used in such a dry-etching process and the etching object film. And the present inventor et al. have also found that purging to be carried out for wafers with use of another gas just after the degas generation is very effective to reduce the degas concentration, thereby reducing the generation of those foreign matters. Therefore, the present inventor et al. have reviewed the purge gas blowing process for dry-etched wafers reloaded in the wafer container just after the dry-etching in the etching apparatus.

As a result, for example, as described in the patent document 2, in case of the method that blows out a purge gas from above the object wafers, it becomes impossible to apply the purge gas onto the surfaces of all the object wafers uniformly. And this makes it difficult to thin the degas generated from the wafers enough and difficult to suppress the generation of foreign matters at the bottoms of the via holes. This is why some improvement is still required for the method. Furthermore, in case of the method described in the patent document 3, which applies the purge gas horizontally to the object wafers, it is possible to suppress the generation of such foreign matters more than the method described in the patent document 2, which blows out the purge gas from above the object wafers. However, foreign matters are still generated on some wafers. Thus some improvement is also required for the method. And in case of the method described in the patent document 4, the water content can be removed while the wafers are transferred, but the method does not take any consideration how to lower the degas concentration that occurs just after the generation of the degas. This has also been a problem. In addition, the method described in the patent document 4 is also required to provide the wafer container with an air cleaner, a dehumidifier, etc. additionally. And in order to satisfy those requirements, the manufacturing cost rises and this has been another problem.

SUMMARY

According to one aspect of the present invention, there is provided a semiconductor device manufacturing method that includes loading plural wafers in a container having a side door so as to be disposed substantially horizontally and in layers vertically therein and reloading dry-etched wafers one by one in the container just after ending a dry-etching process for them; and blowing a purge gas horizontally to the wafers loaded in the container for 30 sec or more after all the subject wafers are loaded in the container while the side door is open.

According to another aspect of the present invention, there is provided a wafer treatment system that includes a controller for controlling so that the purge gas is blown horizontally to the just-dry-etched wafers for 30 sec or more after all the subject wafers are loaded in the container while the side door is open. In the container, the wafers are disposed substantially horizontally and in layers vertically in the container.

Conventionally, as described in the patent document 3, in case of the method that blows out the purge gas horizontally to the object wafers, the generation of foreign matters is reduced more than the method that blows out the purge gas from above the wafers. According to the method, however, the door of the wafer container is closed just after the last object wafer is loaded in the container so as to improve the manufacturing throughput. Consequently, the degas generated from the wafer loaded last into the container in the dry-etching process cannot be thinned enough, thereby generating foreign matters. On the other hand, according to the configuration of the present invention, the purge gas is blown horizontally enough to the object wafers even after the last wafer is loaded into the container just after the dry-etching process. This is why the degas generated from the wafers in the dry-etching process can be thinned and the wafer container can be ventilated satisfactorily.

Here, it is to be understood that modifications will be apparent to those skilled in the art without departing from the spirit of the invention; for example, the embodiment of the present invention described above includes any combinations of the elements and representations even when they are varied among methods, apparatuses, systems, recording media, computer programs, etc.

According to the present invention, therefore, it is possible to reduce the foreign matters that might otherwise be generated due to the degas generated from dry-etched wafers just after the dry-etching carried out for them.

BRIEF DESCRIPTION OF THE DRAWINGS

The above and other objects, advantages and features of the present invention will be more apparent from the following description of certain preferred embodiments taken in conjunction with the accompanying drawings, in which:

FIG. 6 is a flowchart of the processings of a wafer treatment system in the embodiment of the present invention;

FIG. 7 is a table for describing the results of the observation of how foreign matters are generated on the lower layer copper wiring provided at the bottom of a via hole when a dual damascene wiring groove is formed in an interlayer insulation film provided on such a substrate as a silicon substrate described with reference to FIG. 3.

DETAILED DESCRIPTION OF THE PREFERRED EMBODIMENTS

Figure 1:
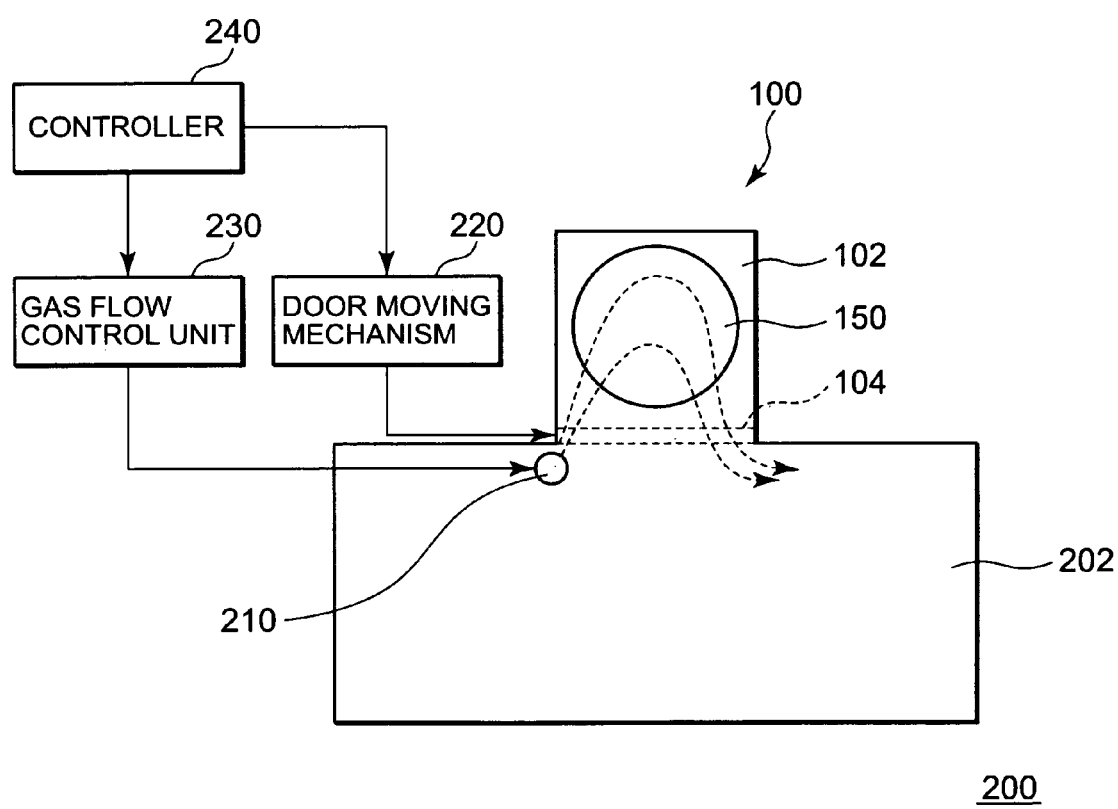
FIG. 1 is an explanatory top view of a configuration of a wafer treatment system and a wafer container in an embodiment of the present invention.

Hereunder, there will be described an embodiment of the present invention with reference to the accompanying drawings. In all those drawings, the same reference numerals will be used for the same components and elements, avoiding redundant descriptions.

Figure 2:
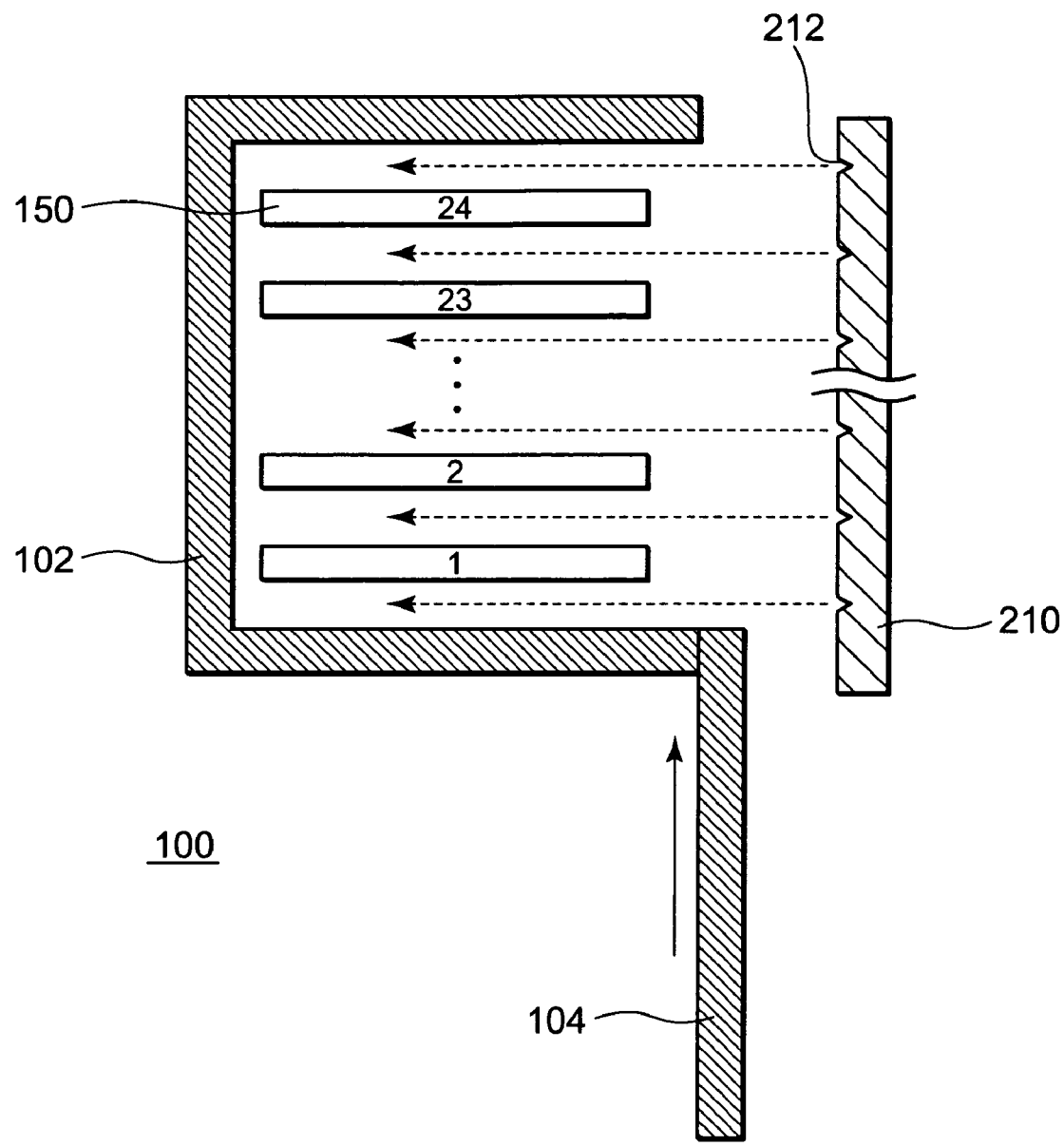
FIG. 2 is a cross sectional view of the wafer container with respect to the configuration shown in FIG. 1.

FIG. 1 is an explanatory top figure of a configuration that includes a wafer treatment system 200 and a wafer container 100 in this embodiment of the present invention. The wafer treatment system 200 includes an etching apparatus 202, a purge gas blow-out nozzle 210, a door moving mechanism 220, a gas flow control unit 230, and a controller 240. FIG. 2 is a cross sectional figure of a configuration that includes the container 100 and the purge gas blow-out nozzle 210.

The wafer container 100 includes a wafer chamber 102 of which one side is open and a door 104 provided at the open side of the wafer chamber 102. The door 104 is slid vertically to be opened or closed. The container 100 can load plural wafers 150 ("1" to "24" in FIG. 2) disposed substantially horizontally and in layers vertically in the wafer chamber 102. Those wafers 150 are loaded and unloaded from the open side of the wafer chamber 102. The container 100 can be a wafer carrier referred to generally as an FOUP.

The etching apparatus 202 carries out dry-etching for those wafers 150. The etching apparatus 202 includes a wafer loader (not shown) and the container 100 is loaded into this wafer loader. The door moving mechanism 220 controls opening and closing of the door 104 of the container 100 loaded in the wafer loader. In this embodiment of the present invention, each time the dry-etching is carried out for a wafer 150 in the etching apparatus 202, the dry-etched wafer is collected sequentially into the container 100.

In the example shown in FIG. 2, the dry-etching is carried out for the "1" to "24" wafers 150 one by one, then collected into the container 100 sequentially. The dry-etching in the etching apparatus 202 can also be carried out for those plural wafers 150 simultaneously. In such a case, the wafers 150 are collected into the container 100 together simultaneously.

The purge gas blow-out nozzle 210 is configured so as to blowout a purge gas horizontally to the wafers 150 in the container 100 loaded in the wafer loader. In this embodiment, the purge gas blow-out nozzle 210 can also be formed so as to have plural purge gas blow-out holes 212. Each of those holes 212 can be disposed so as to supply the purge gas onto the top surfaces of the plural wafers 150 set in the container 100 respectively. The gas flow control unit 230 controls the flow of the purge gas from the nozzle 210.

The controller 240 controls components of the wafer treatment system 200, such as the door moving mechanism 220, the gas flow control unit 230, etc. The functions of the controller 240 will be described later.

Next, there will be described the dry-etching process carried out by the etching apparatus 202 in this embodiment. In this embodiment, the dry-etching process can include forming recesses such as wiring grooves, via holes or contact holes in the interlayer insulation film formed on the wafers 150. In this case, an etching stop film that includes nitrogen can be used as a stopper. In another example, the dry-etching process can also include patterning an aluminum film formed on each of the wafers 150 in a predetermined shape.

FIG. 3 is a cross sectional figure for describing an example of the dry-etching process carried out by the etching apparatus 202. Here, there will be described procedures for forming a dual damascene wiring grove 326 in the interlayer insulation film 306 formed over such a substrate (wafer 150) as a silicon substrate or the like so as to form a copper wiring.

The semiconductor device 300 includes a substrate (not shown), an interlayer insulation film 302 formed on the substrate, a lower layer copper wiring 320, as well as an etching stop film 304, an interlayer insulation film 306, and a protective insulation film 308 formed sequentially in this order on each of the interlayer insulation film 302 and the lower layer copper wiring 320. The etching stop film 304 can be, for example, an SiCN film. Here, via holes 322 are formed in both of the interlayer insulation film 306 and the protective insulation film 308.

Figure 3A:
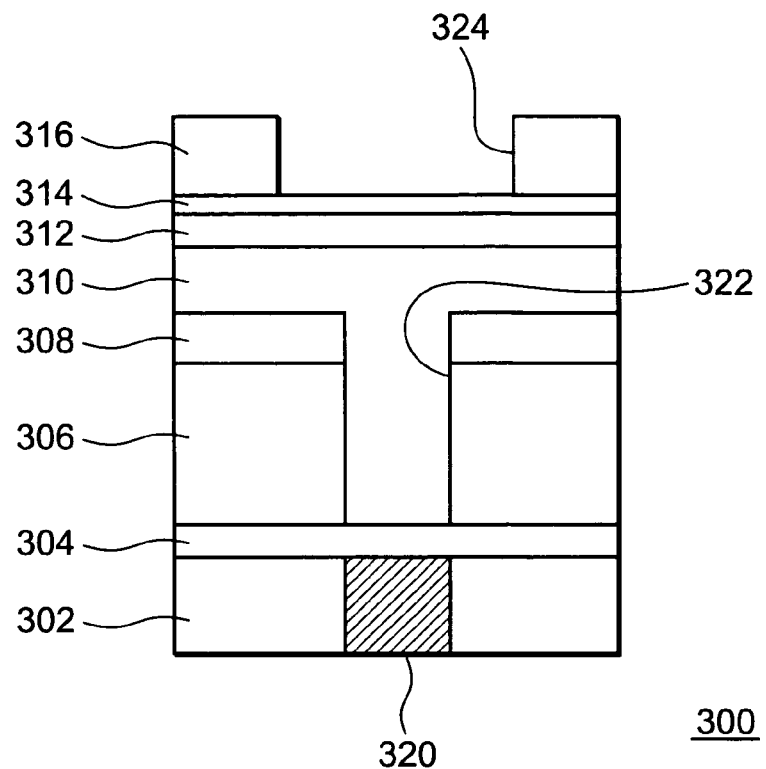
FIG. 3A is a cross sectional view for describing an example of a dry-etching process carried out by an etching system in the embodiment of the present invention.

In order to provide the semiconductor device 300 with a wiring groove, a multilayer resist film is formed on the protective insulation film 308. The multilayer resist film consists of an organic film 310, an intermediate film 312, a reflection preventive film 314, and an upper layer resist film 316. The intermediate film 312 can be, for example, a silicon oxide film. The upper layer resist film 316 has a wiring forming opening 324 (FIG. 3A).

Figure 3B:
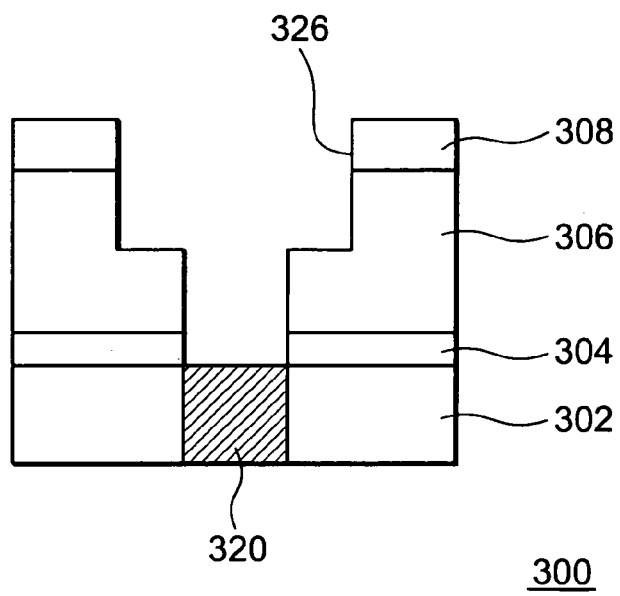
FIG. 3B is another cross sectional view for describing the example of the dry-etching process carried out by the etching system in the embodiment of the present invention.

Then, dry-etching is carried out sequentially for the reflection preventive film 314, the intermediate film 312, the organic film 310, the protective insulation film 308, and the interlayer insulation film 306 with use of the upper layer resist film 316, thereby forming the wiring groove in the protective insulation film 308 and in the interlayer insulation film 306 respectively. Then, the etching stop film 304 is removed from the bottom of each via hole 322 by dry-etching. After this dry-etching, the multilayer resist film is removed by ashing. As a result, a dual damascene wiring groove 326 is formed so as to reach the lower copper wiring 320 in each of the etching stop film 304, the interlayer insulation film 306, and the protective insulation film 308 as shown in FIG. 3B. Here, the etching gas can be a plasma-excited gas that includes fluorine.

If etching is made for such a film as an SiCN film that contains nitrogen with use of an etching gas that contains fluorine, this might cause foreign matters to be generated, for example, on the surface of the lower layer copper wiring 320. And the cause is considered to be the surface of the lower layer copper wiring 320 contaminated by ammonium fluoride.

FIG. 4 is a cross sectional figure for describing another example of the dry-etching process carried out by the etching apparatus 202.

Here, in order to form contacts, contact holes 358 are formed in the interlayer insulation film 346 that is formed over the substrate 342 (wafer 150) such as a silicon substrate.

Figure 4A:
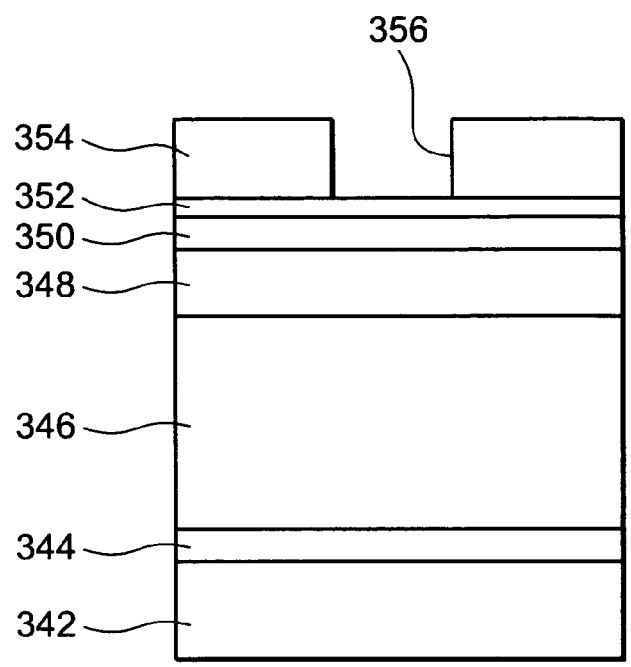
FIG. 4A is a cross sectional view for describing another example of the dry-etching process carried out by the etching system in the embodiment of the present invention.

The semiconductor device 340 includes a substrate 342, an etching stop film 344 formed on the substrate 342, and an interlayer insulation film 346. In order to provide the semiconductor device 340 with a contact hole, a multilayer resist film is formed on the interlayer insulation film 346. The multilayer resist film consists of an organic film 348, an intermediate film 350, a reflection preventive film 352, and an upper layer resist film 354. The intermediate film 350 can be, for example, a silicon oxide film. The upper layer resist film 354 is provided with a contact hole forming opening 356 (FIG. 4A).

Figure 4B:
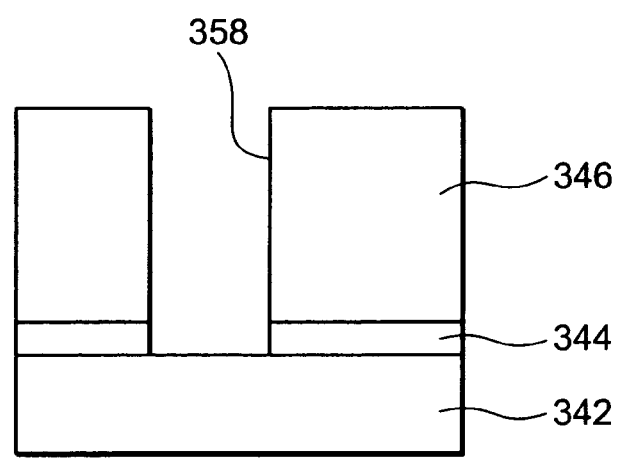
FIG. 4B is a cross sectional view for describing still another example of the dry-etching process carried out by the etching system in the embodiment of the present invention.

Then, dry-etching is carried out sequentially for the reflection preventive film 352, the intermediate film 350, the organic film 348, and the interlayer insulation film 346 with use of the upper layer resist film 354, thereby forming the contact hole 358 in the interlayer insulation film 346. Then, the etching stop film 344 formed at the bottom of the contact hole 358 is removed by dry-etching. After this dry-etching, the multilayer resist film is removed by ashing. As a result, the contact hole 358 comes to reach the substrate 342 in the etching stop film 344 (FIG. 4B). Here, the etching gas can be a plasma-excited gas that includes fluorine.

Even in this case, generation of foreign matters might not be avoided, for example, on the surface of the substrate 342 after the etching. Here, the cause is considered to be the surface of the substrate 342 contaminated by ammonium fluoride generated from the fluorine in the etching gas, and furthermore, from the existence of water in the etching gas.

FIG. 5 is a cross sectional figure for describing another example of the dry-etching process carried by the etching apparatus 202.

Here, there will be described the procedures for forming an aluminum wiring.

Figure 5A:
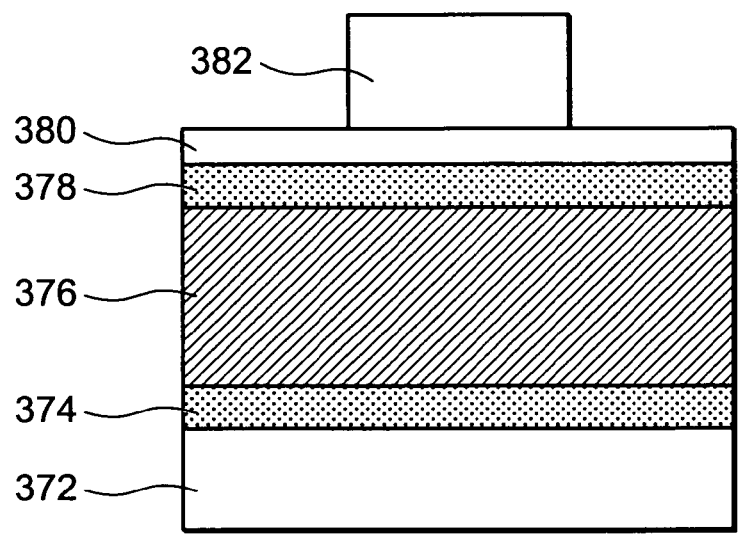
FIG. 5A is a cross sectional view for describing still another example of the dry-etching process carried out by the etching system in the embodiment of the present invention.
Figure 5B:
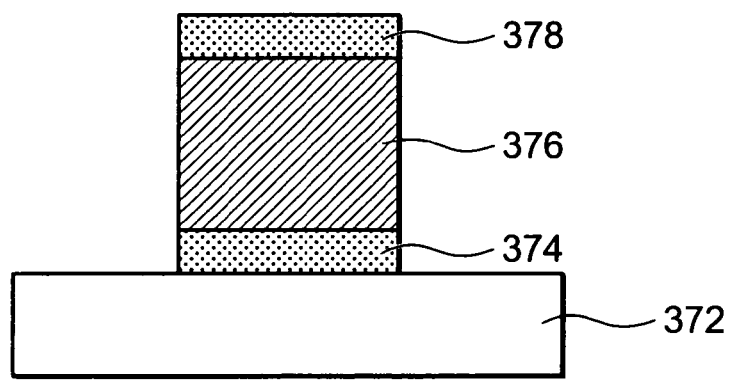
FIG. 5B is a cross sectional view for describing still another example of the dry-etching process carried out by the etching system in the embodiment of the present invention.

The semiconductor device 370 includes a substrate (not shown (used for a wafer 150)), an interlayer insulation film 372 formed on the substrate, a TiN/Ti film 374, an Al film 376, and a TiN film 378. In the semiconductor device 370 configured in such a way, a reflection preventive film 380 and a resist film 382 are formed on the TiN film 378 so as to pattern each of the TiN film 378, the Ai film 376, and the TiN/Ti film 374 in a wiring shape. The resist film 382 is already formed in a wiring shape (FIG. 5A).

Then, dry-etching is carried out sequentially for the reflection preventive film 380, the TiN film 378, the Al film 376, and the TiN/Ti film 374 with use of the interlayer insulation film 372, thereby patterning the TiN film 378, the Al film 376, and the TiN/Ti film 374 in a wiring shape (FIG. 5B) respectively. The etching gas used here can be a plasma-excited gas that includes chlorine.

Even in this case, generation of foreign matters might not be avoided after the etching, for example, on the Ai film 376. Here, it is considered that the foreign matters are generated as follows; at first, an HCl is formed on the Ai film 376 by the chlorine, aluminum, and water content existing in the etching gas, then the HCl dissolves the Al film 376 to generate those foreign matters.

Return to FIGS. 1 and 2. In this embodiment, just after dry-etching is applied to a wafer 150 in the etching apparatus 202, the wafer 150 is collected into the container 100. Then, a purge gas is blown horizontally to the wafer 150 while the side door is open. The purge gas, blown to the wafer 150, moves on the top surface of the wafer 150 as shown with a dotted line arrow in FIGS. 1 and 2, then discharged from the other side of the purge gas blow-out nozzle 210 provided portion. Consequently, the degas on the surface of the wafer 150 can be removed uniformly.

In this embodiment, the purge gas can be any of dry air, dry oxygen, and dry hydrogen that are enough low in water concentration, as well as such an inactive dry gas as Ar, He, nitrogen, etc. The degas is often generated by the reaction of the water content in the air. Therefore, if the purge gas is a dry gas with less water content, the water content that might otherwise exist around the wafers 150 and in the container 100 can be reduced, thereby generation of the degas itself, as well as generation of foreign matters can be suppressed. And when such a purge gas is blown to the wafers, the degas can further be thinned. The flow of the purge gas can be, for example, within 10 L/min to 100 L/min, although it is not specially limited.

The purge gas can be blown to the wafers over a predetermined time after all the subject wafers 150 are collected in the container 100. In this case, the degas on the surface of the wafers 150 can still further be thinned. Concretely, in this embodiment, the purge gas blowing time is controlled in conjunction with the door moving mechanism 220 that controls the door 104 closing timing while the purge gas is blown horizontally to the wafers 105 loaded in the container 100 from the purge gas blow-out nozzle 210 by keeping the door 104 of the container 100 open.

Here, the controller 240 can be used for the above controlling. In this case, the controller 240 controls so that the purge gas is blown horizontally to the dry-etched wafers 150 reloaded in the container 100 just after the dry-etching process in the etching apparatus 202 for more than a predetermined time after all the subject wafers 150 are reloaded in the container 100 while the container door 104 is open. In this embodiment, the predetermined time can be, for example, 30 sec. This is why the degas generated from the wafers in the dry-etching process can be thinned and the container 100 can be ventilated satisfactorily. More preferably, the predetermined time should be 5 min so as to improve the manufacturing yield.

Concretely, in this embodiment, the controller 240 controls the purge gas blowing time synchronously with the controlling of the closing timing of the door 104 by the door moving mechanism 220 while the purge gas is blown horizontally to the wafers 150 loaded in the container 100 from the purge gas blow-out nozzle 210.

And a program installed in a computer is used to execute such functions of the controller 240. For example, a software program that outputs signals for opening/closing the door 104 is used to change the timer setting for the opening/closing, thereby executing the functions of the controller 240.

The controller 240 of the wafer treatment system 200 can consist of any given computer CPU, a memory, a program that enables the components loaded in the memory to function as shown in the figure, such a memory unit as a hard disk that stores the program, and a network connection interface so as to realize the functions of the controller 240. And it is to be understood that modifications of the methods and apparatuses for realizing the controller 240 will be apparent to those skilled in the art.

FIG. 6 is a flowchart of the processings of the wafer treatment system 200 in the embodiment of the present invention. At first, the container 100 is loaded in the wafer loader of the etching apparatus 202 (step S100). Then, the door moving mechanism 220 opens the door 104 of the container 100 under the control of the controller 240 (step S102). In this embodiment, the purge gas is blown out horizontally to the wafers 150 from the purge gas blow-out nozzle 210 from when the container 100 is loaded into the wafer loader of the etching apparatus 202 at least in step S100 to when the container 100 is unloaded from the wafer loader in step S116.

After this, the wafer moving mechanism (not shown) of the etching apparatus 202 takes out the wafers 150 sequentially from the container 100 (step S104) and the etching apparatus 202 carries out dry-etching for those unloaded wafers (step S106). The dry-etched wafers 150 are then accommodated sequentially in the container 100 (step S108). Here, the wafers "1" to "24" shown in FIG. 2 are subjected to the sequential wafer treatment.

Then, the controller 240 determines whether or not all the subject wafers 150 are loaded in the container 100 (step S110). When the last wafer 150 is loaded in the container 100 (YES in step S110), the controller 240 then determines whether or not the predetermined time is reached after all the subject wafers 150 are loaded in the container 100 (step S112). Here, the predetermined time can be 30 sec or over. When the predetermined time is reached (YES in step S112), the controller 240 controls the door moving mechanism 220 so as to close the door 104 of the container 100 (step S114). After this, the container 100 is unloaded from the wafer loader (step S116) and moved to the manufacturing system that carries out the next process.

Next, there will be described the effects of the manufacturing processes of the semiconductor device in this embodiment.

FIG. 7 is a table that shows results of an observation for how foreign matters are generated on the top surface of the lower copper wiring 320 provided at the bottom of the via hole 322 when a dual damascene wiring groove 326 is formed in the interlayer insulation film 306 provided on the substrate (wafer 150), which is, for example, a silicon substrate described with reference to FIG. 3. The mark "xx" in the table denotes that foreign matters are generated more than the "x" denoted case and the mark "o" denotes that no foreign matter generation is recognized.

Here, the etching apparatus 202 carries out dry-etching for the wafers 150 in "slots 1 to 24" sequentially, then the dry-etched wafers 150 are collected into the container 100. It takes about 5 min to complete the dry-etching for each wafer 150.

The category "None" in the table shown in FIG. 7 denotes a case in which no purge gas supply is made from the beginning while the wafers 150 are subjected to dry-etching. After the first wafer 150 in "slot 24" is collected into the container 100, the door 104 is closed in about 2 sec.

The "Supply" in the table denotes a case in which the purge gas is blown horizontally to the wafers 150 in the dry-etching process. Each of the categories "2 sec", "30 sec", "5 min", and "7 min" of "Supply" denotes a time during which the purge gas is further flown continuously while the door 104 is open after all the subject wafers 150 are collected into the container 100. Each time the predetermined times is reached, the door 104 is closed, thereby the supply of the purge gas stops. This means that the wafer 150 in "slot 1" is the first wafer subjected to the dry-etching and the purge gas is blown to the wafer continuously while the dry-etching is carried out for another wafer 150.

As shown in the figure, in case of "No supply" in which no purge gas is flown from the beginning, foreign matters are generated on the top surface of the lower layer copper wiring 320 provided at the bottom of the via hole 322 even for the wafer 150 in "slot 1". In case of the wafer 150 in "slot 24", many foreign matters are generated on the top surface of the lower layer copper wiring 320 provided at the bottom of the via hole 322. This is because the degas on the last wafer is not thinned at all, since the door 104 is closed just after the wafer 150 is collected into the container 100.

Even in case of "Supply" in which the purge gas is blown horizontally to the wafers 150, if the purge gas is supplied to them only for 2 sec after the last wafer is collected into the container, foreign matters are generated on the top surface of the lower layer copper wiring 320 at the bottom of the via hole 322 for the wafer 150 in "slot 24". This is because the supply of the purge gas stops just after the wafer 150 is collected into the container 100 and the door 104 is closed, thereby the degas on the last wafer cannot be thinned enough.

On the other hand, in case of "Supply" in which the purge gas is blown horizontally to the wafers 150, if the purge gas is supplied for 30 sec or more to them after the last wafer 150 is collected into the container 100, no foreign matters are generated on the top surface of the lower layer copper wiring 320 provided at the bottom of the via hole 322 even for the wafer 150 in "slot 24".

In case of "Supply" in which the purge gas is blown horizontally to the wafers 150, if the purge gas supply is kept for more than 5 min after the last wafer 150 is collected into the container 100, the manufacturing yield is improved significantly. This is because the purge gas supply for more than 5 min is effective to thin the degas satisfactorily and stably at the bottom of every via hole 322. Furthermore, because the purge gas blowing is kept for almost the same time as the dry-etching time for each wafer 150 after the last wafer is collected into the container 100, the variation of the manufacturing stability among wafers can be suppressed, thereby semiconductor devices are assured more for favorable and stable performance.

Although not shown here, if the purge gas is blown to the object wafers 150 from above, foreign matters are generated partially on the top surface of the lower layer copper wiring 320 provided at the bottom of each of the via holes even when the purge gas is blown for 30 sec or more after the last wafer is collected into the container 100.

According to the embodiment described above, because the purge gas is blown horizontally to each wafer enough even after the last subject dry-etched wafer is collected into the container, the degas generated from the wafers in the dry-etching process can be thinned enough and the container 100 can be ventilated satisfactorily.

While the embodiment of the present invention has been described with reference to the accompanying drawings, it is to be understood that the embodiment is just an example and modifications are apparent to those skilled in the art.

In the embodiment described above, the purge gas blow-out nozzle 210 is fixed. However, the nozzle 210 can also be formed movably in both horizontal and vertical directions. For example, the nozzle 210 can be formed movably in the horizontal direction to the container 100 when the door 104 of the container 100 is open. In this case, the gas can flow from right to left.

Furthermore, the wafer treatment system 200 can include plural purge gas nozzles 210. In this case, the purge gas can be blown out from those plural nozzles 210 simultaneously.

Furthermore, the purge gas blow-out nozzle 210 can also be configured so that the number of purge gas blow-out holes 212 is less than the number of wafers to be loaded in the container 100. Even in this case, the purge gas nozzle 210 can be moved up/down (in the vertical direction) to blow the purge gas to the wafers 150 loaded in the container 100 sequentially after finishing the dry-etching in the etching apparatus 202.

Furthermore, the wafer treatment system 200 can also be configured to include plural purge gas blow-out nozzles 210 from which the purge gas is blown out simultaneously.

Furthermore, if the system is configured to include plural purge gas blow-out nozzles 210 in such a way, each nozzle 210 can be configured to include plural purge gas blow-out holes 212. In this case, after the last subject wafer is collected into the container 100, the gas flow can be increased only around the last collected wafer 150 to improve the purge efficiency.

Furthermore, the controller 240 can also control the door moving mechanism 220 so that the gas flow control unit 230 stops the purge gas blow-out from the purge gas blow-out nozzle 210 synchronously with the closing timing of the door 104 of the container 100. As a result, the purge gas consumption can be suppressed.

While the opening/closing timing of the door 104 of the container 100 is controlled to control the purge gas blowing time in the above cases, the purge gas blowing time can also be controlled by controlling the gas flow control unit 230.

Figure 8:
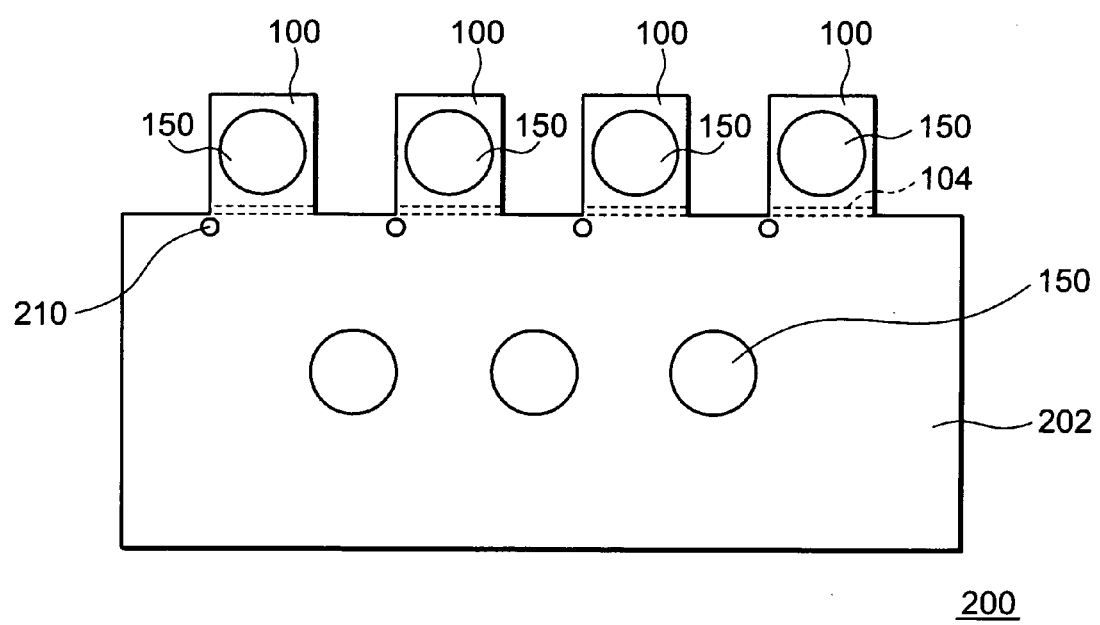
FIG. 8 is an explanatory top view of another example of the configuration of the etching apparatus in the embodiment of the present invention.

Furthermore, the etching apparatus 202 can be configured so as to load plural containers 100 simultaneously as shown in FIG. 8. In this case, while the dry-etching to the plural wafers set in one container 100 is ended and the purge gas is blown to the wafers 150 in the container 100, dry-etching can be carried out for the plural wafers 150 in another container 100. Thus the manufacturing throughput can be prevented from lowering, thereby more favorable performance can be assured for the semiconductor devices.

It is apparent that the present invention is not limited to the above embodiment, but may be modified and changed without departing from the scope and sprit of the invention.

What is claimed is:

1. A semiconductor device manufacturing method, comprising:

performing dry-etching of a plurality of wafers by an etching gas;

loading plural dry-etched wafers one by one in a container comprising a side door so as to he disposed substantially horizontally and in layers vertically therein; and attenuating a degas which is generated by a reaction between the etching gas and an etching object film in the dry-etching by a purge gas, wherein said attenuating the degas includes blowing the purge gas horizontally to the loaded wafers for 30 sec or more after all the dry-etched wafers are loaded in the container while the side door is open.

2. The semiconductor device manufacturing method according to claim 1, wherein the side door is closed when the purge gas is blown horizontally to the wafers loaded in the container from an outside of the container in the blowing of the purge gas, thereby a time of the purge gas blowing is controlled.

3. The semiconductor device manufacturing method according to claim 1, wherein the dry-etching includes forming a recess in an interlayer insulation film formed on each of the wafers by using a stopper that comprises an etching stop film that comprises nitrogen.

4. The semiconductor device manufacturing method according to claim 3, wherein the etching gas used in the forming the recess includes fluorine.

5. The semiconductor device manufacturing method according to claim 3, wherein the recess comprises a wiring groove, a via hole, or a contact hole.

6. The semiconductor device manufacturing method according to claim 1, wherein the dry-etching includes patterning an aluminum film in a predetermined shape while the aluminum film is formed on each of the wafers.

7. The semiconductor device manufacturing method according to claim 6, wherein the patterning the aluminum film in the predetermined shape uses the etching gas that includes chlorine.

8. The semiconductor device manufacturing method according to claim 1, wherein said performing the dry-etching of the plurality of wafers comprises simultaneously performing the dry-etching of the plurality of wafers.

9. The semiconductor device manufacturing method according to claim 1, wherein said attenuating the degas comprises removing the degas from a surface of each of the plurality of wafers.

10. The semiconductor device manufacturing method according to claim 1, wherein, after said dry-etched wafers are loaded in the container, said blowing the purge gas is kept for a same time as a dry-etching time for each of the dry-etched wafers.

11. The semiconductor device manufacturing method according to claim 1, wherein the container comprises a first container and a second container, and wherein, while the dry-etching of the wafers is ended in the first container and the purge gas is blown to the wafers in the first container, the dry-etching is carried out for the plural wafers in the second container.

* * * * *